United States Patent [19]

Penney et al.

[11] Patent Number: 4,701,694
[45] Date of Patent: Oct. 20, 1987

[54] DIGITALLY SELECTABLE, MULTIPLE CURRENT SOURCE PROPORTIONAL TO A REFERENCE CURRENT

[75] Inventors: Bruce J. Penney, Portland; Stewart S. Taylor, Beaverton, both of Oreg.

[73] Assignee: Tektronix, Inc., Beaverton, Oreg.

[21] Appl. No.: 904,595

[22] Filed: Sep. 8, 1986

[51] Int. Cl.⁴ .............................................. G05F 3/22
[52] U.S. Cl. ............................ 323/317; 340/347 DA; 340/347 CC
[58] Field of Search ...................... 323/312, 315–317; 340/347 DA, 347 CC, 347 M

[56] References Cited

U.S. PATENT DOCUMENTS

| | | | |
|---|---|---|---|
| 3,940,760 | 2/1976 | Brokan | 340/347 DA |
| 4,176,344 | 11/1979 | Saari et al. | 340/347 DA |
| 4,349,811 | 9/1982 | Brokan | 340/347 M |
| 4,458,201 | 7/1984 | Keon | 323/317 |

OTHER PUBLICATIONS

Sanford, "Precision Current Source Circuit," IBM Tech. Discl. Bul., vol. 18, No. 9, pp. 2946, 2947, Feb. 1976.

*Primary Examiner*—William H. Beha, Jr.
*Attorney, Agent, or Firm*—William S. Lovell; Daniel J. Bedell

[57] ABSTRACT

A current source utilizes N+1 transistors to produce N output currents of magnitudes proportional to a variable reference current. Each transistor emitter is resistively coupled to a common potential and each transistor base is driven by a common control voltage, offset by a separately adjustable amount for each transistor. The control voltage is produced by an amplifier having a grounded inverting input and a non-inverting input coupled to the collector of a first of the transistors and resistively coupled to a variable reference voltage source. The reference voltage source is adjusted to produce a desired reference current in the collector of the first transistor and the magnitude ratio of an output current produced in the collector of each of the N remaining transistors to the reference current is controlled by adjusting the ratio of emitter resistance of the first transistor to the emitter resistance of the remaining transistors. The control voltager offset for each transistor is adjusted so that the current ratios remain constant over a range of reference current magnitudes despite difference in base-emitter voltage drop between the first and remaining transistors.

16 Claims, 3 Drawing Figures

DIGITALLY SELECTABLE, MULTIPLE CURRENT SOURCE PROPORTIONAL TO A REFERENCE CURRENT

BACKGROUND OF THE INVENTION

The present invention relates to a current source for producing one or more output currents of magnitudes proportional to a variable input reference signal.

Some digital-to-analog convertors (DACs) include a current source for providing N output currents and a set of N switches, one output current and one switch corresponding to each bit of an input N-bit digital word to be converted to a voltage or current of proportional magnitude. Each switch connects one of the output currents to a load resistor when the corresponding bit is true so that the current supplied to the load resistor is equal to the sum of the output currents corresponding to true bits in the input word. When the magnitude of each output current is proportional to the weight of the corresponding bit in the word, the magnitude of the resulting current through the load resistor is proportional to the value of the N-bit word. For example, in standard binary encoding, assuming data bits are referenced from 1 to N in decreasing order of significance, the value represented by bit P (where P is any number from 1 to N) is twice the value represented by bit P+1. Therefore, the Pth output current is adjusted to equal $I\emptyset/(2^{P-1})$, where $I\emptyset$ is a reference current magnitude. Thus the total current passing through the load resistor is equal to the value of the input digital word times $I\emptyset/(2^{N-1})$.

In "multiplying" DACs, the reference current $I\emptyset$ magnitude is adjustable, proportional to an externally generated reference signal, such that the output voltage across the load resistor is nominally proportional to the product of the value of digital word and the magnitude of the reference signal. However, multiplying DACs of the prior art do not accurately maintain constant ratios of proportionality between the output currents and the reference signal as the reference signal is changed, particularly when operating with small power supply voltages. What would be useful is a current source which could produce one or more output currents, each of magnitude proportional to an applied reference signal wherein the constant of proportionality between the reference signal and each output current does not change when the reference signal magnitude is changed.

SUMMARY OF THE INVENTION

According to one aspect of the invention, a current source utilizes N+1 transistors to produce N output currents of magnitudes proportional to a variable reference current. Each transistor emitter is coupled through a separate emitter resistor to a common potential and each transistor base is driven by a common control voltage, offset by a separately adjustable amount for each transistor. The control voltage is produced by an operational amplifier having a grounded inverting input and having a non-inverting input coupled to the collector of a first of the transistors and resistively coupled to a variable reference voltage source. The reference voltage develops a proportional reference current in the collector of the first transistor and each of the remaining N transistors provides its collector current as a separate one of the N output currents. The ratio of proportionality of each output current to the reference current is controlled by adjusting the emitter resistor of the transistor supplying the output current. The control voltage offset for each transistor base is adjusted to ensure that the emitters of all transistors are at substantially the same potential and to compensate for differences in base-emitter voltage among the transistors such that the ratio of each output current to the reference current remains substantially constant over a range of reference current magnitudes.

According to another aspect of the invention, the control voltage offset for each transistor is proportional to the absolute temperature of the current source in order to compensate for variation in base-emitter voltage of the transistor with temperature. This ensures that the transistor collector current remains substantially constant despite changes in temperature of the current source.

It is accordingly an object of the invention to provide a current source for producing one or more output currents of magnitudes proportional to a variable reference signal.

It is another object of the invention to provide a variable current source wherein the magnitude ratio of the output current to the reference signal remains substantially constant as the magnitude of the reference signal changes.

It is a further object of the invention to provide a current source wherein the output current magnitude is substantially unaffected by changes in temperature.

The subject matter of the present invention is particularly pointed out and distinctly claimed in the concluding portion of this specification. However, both the organization and method of operation of the invention, together with further advantages and objects thereof, will best be understood by reference to the following description taken in connection with the accompanying drawings.

DRAWINGS

DETAILED DESCRIPTION

Figure 1:
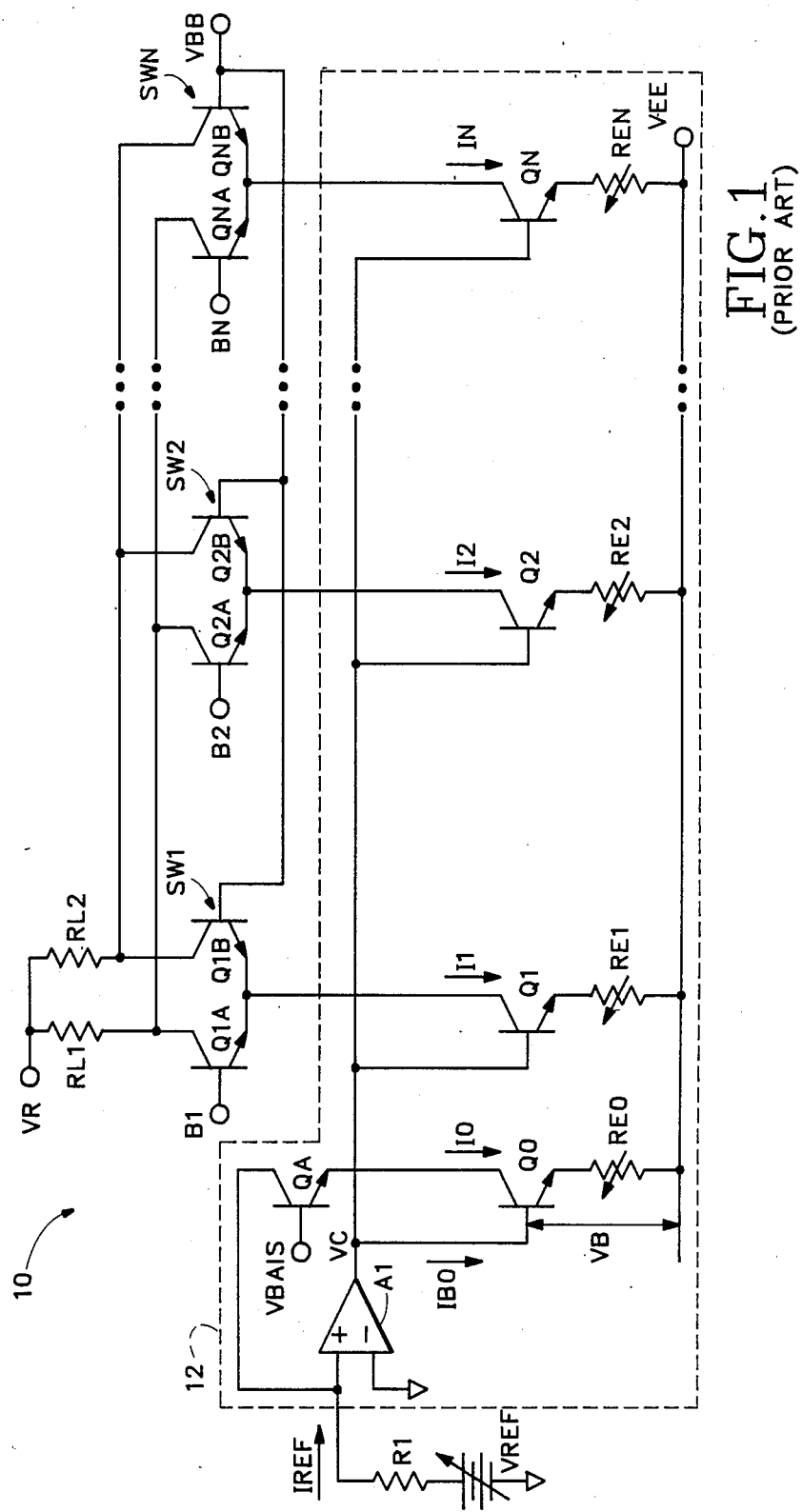
FIG. 1 is a schematic diagram of the multiplying digital-to-analog convertor utilizing a multiple current source of the prior art.

FIG. 1 depicts in schematic diagram form a digital-to-analog convertor (DAC) $1\emptyset$ utilizing a multiple current source array 12 of the prior art to produce N output currents (I1, I2 . . . IN) wherein the magnitude ratio of each output current to an input reference current IREF is independently adjustable. Each output current I1-IN is selectively applied to either one of two load resistors RL1 and RL2 by a corresponding electronic switch SW1-SWN, the switching state of each switch being controlled by a corresponding bit B1-BN of an N-bit digital word. Each output current I1-IN is produced as the collector current of a corresponding NPN transistor Q1-QN having an emitter connected to a common potential VEE through an adjustable emitter resistor RE1-REN and having a base connected to a common control voltage VC. When a bit B1-BN of the input word is true (high), the switch SW1-SWN controlled by the bit directs the corresponding current I1-IN through RL1, and when the bit is false (low) the current is directed through RL2. The magnitudes of currents I1-IN are calibrated to be proportional to the weighting of the corresponding bits B1-BN. For example, if the input word utilizes standard binary coding with B1 the most significant bit and BN the least significant bit (i.e., bit B1 has twice the weight of bit B2, bit B2 has twice the weight of bit B3, etc.), then current I1 has twice the magnitude of I2, I2 has twice the magnitude of I3, etc. Thus the magnitude of the total current directed through RL1, and the magnitude of the voltage across RL1, are proportional to the magnitude of the input data word.

Switch SW1 comprises a pair of transistors Q1A and Q1B having emitters tied to the collector of Q1. The collectors of transistors Q1A and Q1B are connected to a positive voltage VR through load resistors RL1 and RL2, respectively. The most significant bit B1 of the input word controls the base of Q1A while a voltage VBB is applied to the base of Q1B. When B1 is true it is higher than VBB, Q1A is on, Q1B is off, and current I1 is directed by Q1A through RL1. Conversely, when B1 is false, it is lower in magnitude than VBB such that Q1B is on, Q1A is off, and the current I1 is directed through RL2 by Q1B. Switches SW2-SWN are similar to switch SW1 except that the bases of transistors Q2A-QNA of switches SW2-SWN are controlled by bits B2-BN, respectively, and the emitters of transistors Q2A-QNA and Q2B-QNB of switches SW2-SWN are tied to the collectors of Q2-QN, respectively, to switch currents I2-IN.

The control voltage VC applied to the base of each transistor Q1-QN is produced at the output of a high gain, high input impedance operational namplifier A1. VC is also applied to the base of another NPN transistor Q0 having an emitter coupled nto VEE through a resistor RE0 and a collector attached to the emitter of an NPN transistor QA. The base of QA is connected to a biasing voltage VBIAS, suitably equal to VBB, while the collector of QA is connected to the non-inverting input of amplifier A1, thereby creating a negative feedback loop for A1 through transistors Q0 and QA. An external variable reference voltage source VREF is connected to the non-inverting input of amplifier A1 through a resistor R1 and the inverting input of amplifier A1 is grounded. In this arrangement, the inverting and non-inverting inputs of A1 are both maintained substantially at ground potential so that a reference current IREF (equal to VREF/R1) passes through R1 and into the collector of QA. QA produces an emitter current I0 (proportional and substantially equal to IREF) supplied to the collector of transistor Q0. The negative feedback causes amplifier A1 to produce control voltage output VC of magnitude sufficient to produce a base current IB0 in Q0 which is equal to I0 divided by the current gain of Q0. More specifically, the output voltage VC is such that the difference VB between VC and VEE is approximately:

$$VB = VC - VEE = [I0 * RE0] + VBE0$$

where VBE0 is the base-emitter voltage of Q0. Assuming that the base-emitter voltages of Q1-QN are substantially the same as the base-emitter voltage of Q0, the emitters of Q1-QN will be at substantially the same potential as the emitter of Q0. Consequently the ratio of any current IP (where P equals any number from 1 through N) to I0 will equal the ratio of emitter resistor RE0 to emitter resistor REP. Thus, assuming that the DAC 10 is adapted for converting a standard binary encoded input word, RE1 is adjusted to equal RE0 so that I1 is equal to I0, RE2 is adjusted to twice the value of RE0 so that I2 is equal to I0/2, and so on.

However the assumption that the base-emitter voltages of transistors Q0-QN are all equal is not valid. Even though transistors Q0-QN may be implemented on a common integrated circuit chip so that they have similar characteristics, and although the emitter area of each transistor may be sized in proportion to the emitter current it must carry so as to further limit variations in base-emitter voltage among transistors, significant differences in base-emitter voltage among transistors cannot be avoided due to variations in photolithography, impurity profiles, etc. Therefore ratios of currents I1-IN to I0 will not exactly correspond to the ratios of emitter resistor RE0 to emitter resistors RE1-REN. Furthermore, at low current levels, base-emitter voltage mismatches result in relatively large mismatches in the ratios of I1-IN to I0 even when resistors RE1-REN ratio precisely to RE0. Also when resistors RE0-REN are fixed, rather than adjustable, their actual values will vary somewhat from intended values due to limitations in the tolerance with which they are fabricated. Accordingly, where high accuracy is desired, resistors RE1-REN are implemented as adjustable resistors. When RE1-REN are adjustable, current I1 is calibrated by driving bit B1 true and adjusting resistor RE1 until I1 is the correct value as determined by measuring the voltage across resistor RL1. Currents I2-IN are calibrated in a similar manner by successively setting bits B2-BN high and adjusting RE2-REN to produce the appropriate output voltages across RL1. When the output currents I1-IN of current source array 12 are calibrated in this fashion, the DAC 10 of the prior art can be highly accurate even though the transistors have different base-emitter voltages, provided that the reference voltage VREF is constant and set to the value used when the current source array 12 was calibrated and the voltage drops across RE1-REN are large compared to the base-emitter voltage mismatches of Q0-QN.

In some applications one may wish to use DAC 10 as a "multiplying" DAC wherein the reference voltage VREF is permitted to vary. Since the output voltage across RL1 is nominally proportional the product of VREF (or IREF) and the magnitude of the digital input word, the DAC acts as a multiplier. For example, VREF might be produced by another DAC in proportion to a first data word while a second data word is applied as the input data to DAC 10. In this arrangement, the voltage across RL1 is proportional to the product of the two data words. One difficulty in using current source array 12 of the prior art in a multiplying DAC arises from the fact that the base-emitter voltages of the transistors Q1-QN are typically not the same as for transistor Q0. Although the emitter resistors RE1-REN may be adjusted to compensate for differences in base-emitter voltage when the current source is calibrated as described hereinabove, the compensation is appropriate only for the particular value of reference voltage used during the calibration process and at the temperature the calibration was made. For example, when the base-emitter voltage of transistor Q1 is larger than the base-emitter voltage of Q0, it is necessary to adjust resistor RE1 to a value which is somewhat smaller than RE0 so that I1 will equal I0. But the amount of decrease in RE1 required to compensate for the difference in base-emitter voltage between Q0 and Q1 depends on the current I1 through RE1. If I1 is large, the amount of resistance decrease required is smaller than if I1 is small. Consequently, as the output currents I1-IN are increased or decreased from their calibration values by changing VREF, the ratios of proportionality between the output currents I1-IN and the current I0 and the ratios of proportionality among I1-IN change, degrading the accuracy of the DAC. Thus while the ratios of I1-IN to I0 may be accurately adjusted for one value of VREF (or IREF) by adjusting RE1-REN, the ratios do not remain constant as VREF is increased or decreased from its calibration value and the accuracy of the convertor is accordingly degraded. Also, as temperature varies the base-emitter voltage differences among Q0-QN vary and modify the ratios among I0-IN.

Figure 2:
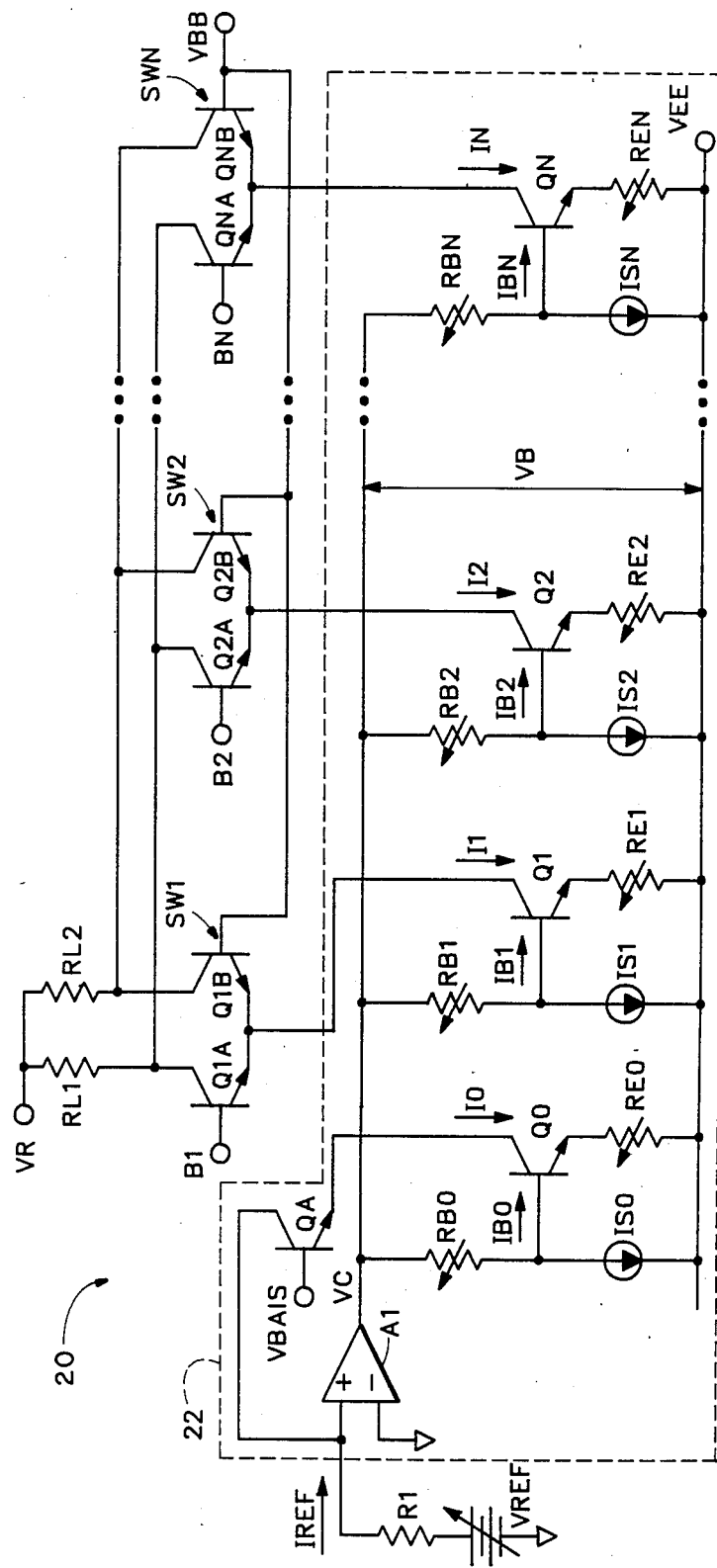
FIG. 2 is a schematic diagram of the multiplying digital-to-analog convertor utilizing a multiple current source according to the present invention.

FIG. 2 shows in schematic diagram form a DAC 20 which is similar to DAC 10 of FIG. 1 except that the prior art current source array 12 of FIG. 1 has been modified to form an improved current source array 22 according to the present invention. In current source array 22 the bases of transistors Q0-QN are not directly connected to the control voltage output VC of amplifier A1 (as in current source array 12 of FIG. 1) but rather each base is connected to VC through a corresponding base resistor RB0-RBN. In addition, a separate current source IS0-ISN is inserted between the base of each transistor Q0-QN and VEE. Each current source IS0-ISN and its corresponding base resistor RB0-RBN cooperate to produce an offset voltage across the base resistor RB0-RBN which offsets the control voltage VC before it is applied to the base of the corresponding transistor Q0-QN to drive base currents IB0-IBN in transistors Q0-QN. The magnitude of the offset voltage produced across each base resistor RB1-RBN may be adjusted by adjusting the value of the base resistor.

The offset voltages across base resistors RB1-RBN are adjusted to compensate for differences between the base-emitter voltage of each transistor Q1-QN and the base-emitter voltage of transistor Q0 so that each transistor Q0-QN emitter is at the same potential for any given value of reference voltage VREF and therefore reference current I0. Although the Q0-QN emitter potentials change as VREF changes, they all change by the same amount and the ratios of output currents I1-IN to I0 remain constant. Thus the emitter resistors RE1-REN need not be adjusted to compensate for differences in base-emitter voltages but only to ratio RE1-REN to RE0 so as to set the ratios of proportionality between currents I1-IN and I0. Consequently, these ratios of proportionality are not affected by changes in current through the emitter resistors due to changes in IREF.

To calibrate multiple current source array 22, VREF is initially set to a low value so that currents I0-IN are small enough that the resulting potential drops across RE0-REN are not significant (e.g., where the product of I0 and RE0 is suitably less than about 1 mV). Bit B1 is set high and RB1 is adjusted (trimmed when implemented as a laser trimmed resistor on an integrated circuit) until the current through load resistor RL1 has the correct magnitude in view of the known small IREF input value and the value of the digital input word (i.e., B1 is true, B2-BN are false). This ensures that $$VBE0 + (IS0 + IB0)RB0 = VBE1 + (IS1 + IB1)RB1$$

where VBE0 is the base-emitter voltage of Q0 and VBE1 is the base-emitter voltage of Q1. Then bit B2 is set high and RB2 is adjusted so that the current through load resistor RL1 is the correct value for bit B2 true, and bits B1 and B3-BN false. The process is repeated for each bit B3-BN of the input word until all base resistors RB1-RBN are calibrated in this fashion. When the base resistors RB1-RBN are calibrated, the offset voltage across each base resistor RB1-RBN differs from the offset voltage across base resistor RB0 by an amount that compensates for differences between the base-emitter voltage of each transistor Q1-QN and the base-emitter voltage of transistor Q0 so that the emitters of transistors Q0-QN are all substantially at the same potential for any permissible value of IREF. Since the potentials across RE1-REN are all negligible, moderate deviation from the ideal settings of RE1-REN has no significant effect on the accuracy of the adjustment of RB1-RBN.

The VREF voltage is then increased to its full scale value and emitter resistors RE1-REN are calibrated by successively setting each bit B1-BN true and adjusting the associated resistor RE1-REN until the current through RL1 has the correct magnitude for the given full scale VREF value and input data word value so that I1-IN ratio to one another accurately in the desired binarily weighted fashion. When the multiple current source array 22 of FIG. 2 is calibrated in this fashion, the ratios of proportionality between I1-IN and I0 remain substantially constant over the full scale range of VREF irrespective of variations in the base-emitter voltages among transistors Q0-QN. Thus the DAC 20 of FIG. 2 utilizing the improved multiple current source array 22 according to the present invention is more accurate and therefore suitable for use as a multiplying DAC than DAC 10 of FIG. 1 utilizing the prior art current source array 12 wherein current ratios change as IREF is changed from its calibration value.

Referring to the prior art circuit of FIG. 1, the base-emitter voltage of each transistor Q0-QN is inversely proportional to the absolute temperature of the transistor and therefore changes in the temperature of the circuit components cause changes in the base-emitter voltages of Q0-QN which in turn change the ratios of the output currents I1-IN to current I0. However, referring to FIG. 2, in the current source array 22 of the present invention, current sources IS0-ISN are adapted to produce currents through the base resistors RB0-RBN which are proportional to absolute temperature (PTAT). These PTAT currents produce offset voltages across base resistors RB0-RBN which are also PTAT such that a temperature change causing a change in the base-emitter voltages of transistors Q0-QN causes compensating changes in the offset voltages produced across base resistors RB0-RBN whereby the sum of each base-emitter voltage and its corresponding adjustable PTAT offset voltage is substantially the same irrespective of temperature changes. If RE0-REN are adjusted to ratio in a desired fashion, the collector currents of transistors Q0-QN will also ratio in the desired fashion, irrespective of changes in circuit temperature as well as changes in VREF.

Figure 3:
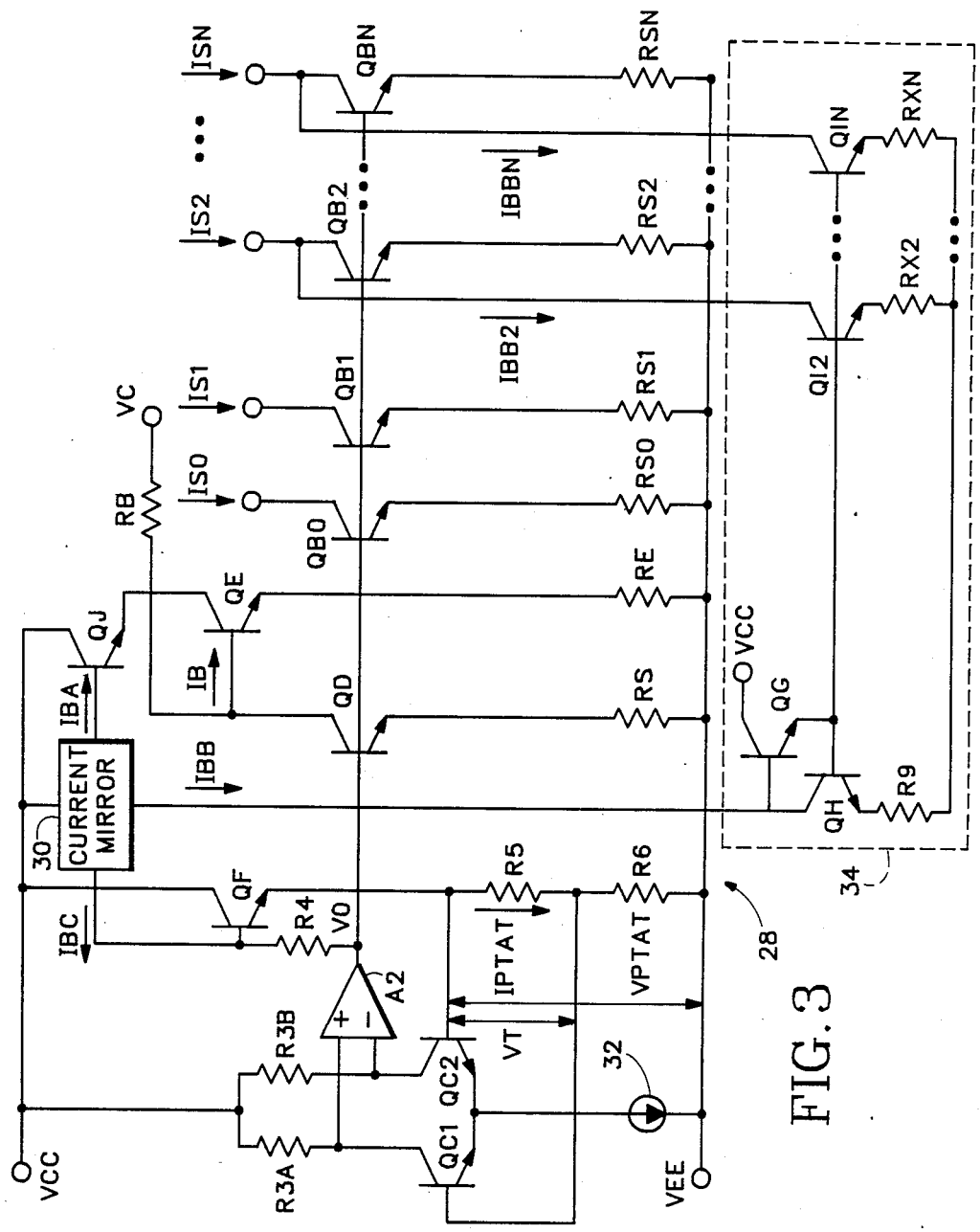
FIG. 3 is a schematic diagram showing a portion of the multiple current source of FIG. 2 in more detail.

Referring to FIG. 3, a circuit 28 depicted in schematic diagram form implements current sources IS0-ISN of FIG. 2 by generating a set of output currents IS0-ISN, each comprising the collector current of a corresponding one of a set of similar NPN transistors QBØ-QBN. The emitter of each transistor QBØ-QBN is connected to voltage source VEE of FIG. 2 through a corresponding resistor RSØ-RSN while the base of each transistor QBØ-QBN is driven by the output VØ of a high gain operational amplifier A2. The output of amplifier A2 is also connected through a resistor R4 to the base of an NPN transistor QF and to the base of an NPN transistor QD. The emitter of QD is coupled to VEE through a resistor RS while the collector of QD is coupled to control voltage VC (produced by amplifier A1 of FIG. 2) through a resistor RB and to the base of another NPN transistor QE. A resistor RE connects the emitter of transistor QE to VEE. The collector of QE is tied to the emitter of an NPN transistor QJ and the collector of QJ is tied to a voltage source VCC.

Transistors QE and QJ are similar to transistor QØ in FIG. 2 and resistors RB and RE have the same resistances as resistors RBØ and REØ, respectively, of FIG. 2. Thus the base current IB supplied to QE and the base current IBA supplied to QJ are substantially equal in magnitude to the base current IBØ supplied to transistor QØ of FIG. 2. Base current IBA is drawn from a current mirror 3Ø which produces a pair of output currents IBB and IBC equal in magnitude to IBA and therefore to current IBØ of FIG. 2. Current IBC is supplied to the junction between the base of transistor QF and resistor R4. The base current of QF is small and the voltage drop across R4 is substantially equal to IBC*R4.

The collector of QF is connected to VCC while the emitter of QF is coupled to VEE through two series connected resistors R5 and R6. The collectors of a pair of NPN transistors QC1 and QC2 are tied to the non-inverting and inverting inputs, respectively, of amplifier A2 and to VCC through identical resistors R3A and R3B, respectively. The emitters of QC1 and QC2 are coupled to VEE through a current source 32. Resistor R5 connects the bases of QC1 and QC2. The emitter areas of transistors QC1 and QC2 (AREA1 and AREA2, respectively) differ, and a potential VT is developed across R5. The magnitude of VT is controlled according to the expression $$VT = VBE(QC2) - VBE(QC1)$$

where VBE(QC2) is the base-emitter voltage of transistor QC2 and VBE(QC1) is the base-emitter voltage of transistor QC1. VBE(QC1) is equal to $(K*T/q)\ln(IC1/IS1)$ where IC1 is the collector current of transistor QC1, IS1 is its saturation current, K is Boltzman's constant, T is the absolute temperature of the circuit, and q is the charge on an electron. Similarly, VBE(QC2) is equal to $(K*T/q)\ln(IC2/IS2)$ wherein IC2 and IS2 are the collector and saturation currents of QC2. Thus $$VT = (K*T/q)\ln(IC2/IS2) - (K*T/q)\ln(IC1/IS1).$$

Since IC1 and IC2 are substantially equal, $$VT = (KT*q)\ln(IS1/IS2),$$

and since IS1 is proportional to the emitter area (AREA1) of QC1 and IS2 is proportional to the emitter area (AREA2) of QC2, then $$VT = (K*T/q)\ln(AREA1/AREA2).$$

In the above expression VT is proportional to absolute temperature (PTAT). The current IPTAT through R5 is VT/R5. Neglecting the current supplied to the base of QC1, which is small compared to IPTAT, and with resistors R5 and R6 sized such that the sum of R5 and R6 is equal to R4, the voltage VPTAT across R5 and R6 will be equal to the product of IPTAT and R4.

The output voltage of amplifier A2 in the circuit equals $$VØ = VEE + VPTAT + VBE - (IBØ*R4)$$

where VBE is the base-emitter voltage of QF and IBØ is equal to IBC. VØ is connected to the bases of transistors QBØ-QBN and QD. Transistors QBØ-QBN are similar to transistor QF and have similar base-emitter voltages, VBE, while resistors RSØ-RSN are all of the same resistance magnitude as R4.

Rearranging the last expression above, the voltage across each resistor RSO-RSN is $$VØ - VBE - VEE = VPTAT - (IBØ*R4).$$

Inasmuch as the value of each resistor RSØ-RSN is equal to R4, the emitter current in each transistor QBØ-QBN supplied through the corresponding resistor RSØ-RSN is computed by dividing the voltage across the corresponding resistor by R4 and is thus equal to VPTAT/R4−IBØ. Since the sum of R5 and R6 is equal to R4, and since VPTAT/(R5+R6) is equal to IPTAT, VPTAT/R4 is equal to IPTAT. Therefore the emitter current of each transistor QBØ-QBN supplied through each corresponding resistor RSØ-RSN is IPTAT-IBØ. The collector currents of QBØ-QBN are substantially equal (with about 1% difference) to the respective emitter currents. Therefore the collector current of each transistor QBØ-QBN is substantially equal to IPTAT-IBØ.

Referring to FIG. 2, the base current supplied to transistor QØ is IBØ and the base current IB1 supplied to Q1 is equal to IBØ. Accordingly if ISØ and IS1 are equal to IPTAT-IBØ, then the currents through resistors RBØ and RB1 are equal to IPTAT. When the value of IPTAT is chosen (by choosing resistors R5 and R6 and/or the ratio of emitter areas of transistors QC1 and QC2 of FIG. 3) such that RBØ*IPTAT is in the range of approximately 5 to 20 millivolts, changes in the differences in base-emitter voltage among transistors QØ-QN due to temperature fluctuations will be substantially compensated by changes in the offset voltages across RBØ-RBN brought about by fluctuations in IPTAT after RBØ-REN have been adjusted to compensate for base-emitter voltage differences in QØ-QN.

The base current supplied to transistor Q2 of FIG. 2 is about half the magnitude IBØ of the base current supplied to transistor QØ or Q1 because I2 is equal to IØ/2. Consequently, IS2 must be equal to IPTAT−IBØ/2 in order to insure that the current through RB1 is IPTAT. Referring to FIG. 3, the collector current of QB2 has a same magnitude (IPTAT-IBØ) as the collector current ISØ of QBØ since QBØ and QB2 are similar and since RSØ and RS2 are similar. In order to provide a current IS2 equal to IPTAT−IBØ/2, a current IBB2 having a value of IBØ/2 is added to the collector current of QB2. Similarly, the base currents supplied to transistors Q3-QN of FIG. 2 are approximately equal to $IBØ/2^{P-1}$, where P is the second character of the transistor number. Thus currents IBB2-IBBN having magnitudes according to the expression $$IBBP = IBØ(1 - 2^{1-P})$$

are added to the collector currents of transistors QB2–QBN of FIG. 3 in order to produce currents IS-2–ISN. The currents IBB2–IBBN are produced by a magnifying current mirror 34 comprising a set of NPN transistors QI2–QIN which provide currents IBB-2–IBBN at their collectors. Emitters of QI2–QIN are coupled to VEE through a set of resistors RX2–RXN while the bases of QI2–QIN are connected to the base of a transistor QH and to the emitter of a transistor QG. The collector of QG is connected to VCC, the emitter of QH is tied to VEE through a resistor R9, and the collector of QH is connected to the base of QG. The current output IBB of the current mirror 30 is supplied to the base-collector junction of QG and QH. Current mirror 32 operates in a known fashion to produce current IBB2 as a function of IBB according to the expression $$IBB2 = IBB\ (R9/RX2).$$

The magnitudes of currents IBB3–IBBN are determined according to similar expressions where RX2 is replaced by RX3–RXN. Since IBB is equal to IB∅, IBB2 may be set equal to IB∅/2 by letting RX2 equal 2*R9. Similarly IBB3 may be set to 3*IB∅/4 by letting RX3 equal 4*R9/3. The other resistors RX4–RXN may also be adjusted to produce the appropriate values for IBB4–IBBN as fractional multiples of IB∅ to ensure that currents IS4–ISN have the correct values. The emitter areas of QI2–QIN are chosen to scale to the emitter area of QH in a known fashion to keep the base-emitter voltages of QI2–QIN equal to the base-emitter voltage of QH.

Thus it is seen the current source array 22 of FIG. 2 produces multiple output currents I1–IN which have substantially constant ratios of proportionality to an input reference signal (VREF or IREF) and to each other over a range of input reference signal magnitudes regardless of differences in the base-emitter voltages among transistors Q∅–QN. This is due to the compensation provided by the adjustable offset voltages produced across RB1–RBN. In addition, the use of current sources IS∅–ISN, adapted to produce currents proportional to absolute temperature through resistors RB∅–RBN, enables offset voltages across resistors RB∅–RBN to automatically compensate for changes in emitter-base voltages in Q∅–QN due to circuit temperature variation so as to insure that the output currents remain substantially constant for a given VREF despite temperature variations.

It is to be understood that the array of weighted current sources implemented with transistors Q1–QN and emitter resistors RE1–REN as shown in FIG. 2 could be implemented with transistors similar to Q1–QN in combination with other types of resistor networks, as, for example, weighted ladder networks to be used in place of the network formed by resistors RE1–REN.

It is also to be understood that the NPN bipolar junction transistors shown in FIGS. 2 and 3 could be replaced with other transistors such as PNP junction transistors, MOSFETs, MESFETs or the like in which a signal applied to a control terminal such as a base or gate controls current though a pair of load terminals such as a collector and emitter, or drain and source. However the magnitudes of the resistors and voltages in the circuit must be suitably adjusted to account for differences in biasing requirements. Accordingly, while a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

We claim:

1. An apparatus for producing an output signal of magnitude proportional to a reference signal comprising:

first and second transistors, each having a control terminal and first and second load terminals, said reference signal being operatively coupled to the first load terminal of said first transistor and the second load terminal of each said transistor being connected so as to provide a first current source for each said transistor, respectively;

means responsive to said reference signal for generating a control voltage coupled to the control terminal of said first transistor; and means for offsetting said control voltage by an adjustable offset amount to produce an offset control voltage, said offset control voltage being applied to the control terminal of said second transistor such that said output signal is produced by said first load terminal of said second transistor, and said offset amount being adjusted so that potential difference between the control voltage and the second load terminals of said first and second transistors are substantially equal, wherein said means for offsetting said control voltage comprises:

a second current source; and an adjustable resistor, the control terminal of said second transistor being coupled to said control voltage through said adjustable resistor and being coupled to said second current source.

2. The apparatus according to claim 1 wherein said means for generating said control voltage comprises an operational amplifier having an input coupled to said first load terminal of said first transistor.

3. The apparatus according to claim 1 wherein said adjustable resistor comprises a laser trimmed resistor implemented in integrated circuit form.

4. The apparatus according to claim 1 wherein said second current source produces a current having a component proportional to the absolute temperature of the second transistor.

5. An apparatus for producing multiple output signals each of magnitude proportional to a reference signal, the apparatus comprising:

a first transistor and a plurality of second transistors, each of said first and second transistors having a control terminal and first and second load terminals, said reference signal being operatively coupled to the first load terminal of said first transistor and the second load terminal of each said transistor being connected so as to provide a first current source for each said transistor, respectively;

means responsive to said reference signal for generating a control voltage coupled to the control terminal of said first transistor; and means for offsetting said control voltage by adjustable offset amounts to produce a plurality of offset control voltages, each said offset control voltage being applied to the control terminal of a separated one of said second transistors such that a separate one of said output signals is produced by the first load terminal of each of said second transistors, and said offset amount being adjusted so that potential differences between the control voltage and the second load terminals of said first transistors and each one of said second transistors are substantially equal, wherein said means for offsetting said control voltage comprises:

a plurality of second current sources; and a plurality of adjustable resistors, the control terminals of each of said second transistors being coupled to said control voltage through a separate one of said adjustable resistors and to a separate one of said second current sources.

6. The apparatus according to claim 5 wherein said means for generating said control voltage comprises an operational amplifier having an input coupled to said first load terminal of said first transistor.

7. The apparatus according to claim 5 wherein said adjustable resistors comprise laser trimmed resistors implemented in integrated circuit form.

8. The apparatus according to claim 5 wherein each of said plurality of second current sources produces a current having a component proportional to the absolute temperature of the second transistor to which it is coupled.

9. An apparatus for producing an output signal of magnitude proportional to a reference signal comprising:

first and second transistors, each of said first and second transistors having a base, a collector and an emitter, said reference signal being operatively coupled to the collector of said first transistor and the emitter of each said transistor being connected so as to provide a first current source for each said transistor, respectively;

means responsive to said reference signal for generating a control voltage coupled to the base of said first transistor; and means for offsetting said control voltage by an adjustable offset amount to produce an offset control voltage, said offset control voltage being applied to the base of said second transistor such that said output signal is produced by the collector of said second transistor, and said offset amount being adjustable so that potential differences between the control voltage and the emitters of said first and second transistors are substantially equal;

wherein said means for offsetting said control voltage comprises:

a second current source; and an adjustable resistor, the base of said second transistor being coupled to said control voltage through said adjustable resistor and to said second current source.

10. The apparatus according to claim 9 wherein said means for generating said control voltage comprises an operational amplifier having an input coupled to the collector of said first transistor.

11. The apparatus according to claim 9 wherein said adjustable resistor comprises a laser trimmed resistor implemented in integrated circuit form.

12. The apparatus according to claim 9 wherein said second current source produces a current having a component proportional to the absolute temperature of the second transistor.

13. An apparatus for producing multiple output signals each of magnitude proportional to a reference signal, the apparatus comprising:

a first and a plurality of second transistors, each having a base, a collector and an emitter, said reference signal being operatively coupled to the collector of said first transistor and the emitter of each said transistor being connected so as to provide a first current source for each said transistor, respectively;

means responsive to said reference signal for generating a control voltage coupled to the base terminal of said first transistor; and means for offsetting said control voltage by adjustable offset amounts to produce a plurality of adjustable offset control voltages, each said offset control voltage being applied to the base of a separate one of said second transistors such that a separate one of said output signals is produced by the collector of each of said second transistors, and said offset amounts are adjusted so that potential differences between the control voltage and the emitters of said first and second transistors are substantially equal, wherein said means for offsetting said control voltages comprises:

a plurality of second current sources; and a plurality of adjustable resistors, the bases of each of said second transistors being coupled to said control voltage through a separate one of said adjustable resistors and to a separage one of said second current sources.

14. The apparatus according to claim 13 wherein said means for generating said control voltage comprises an operational amplifier having an input coupled to the collector of said first transistor.

15. The apparatus according to claim 13 wherein each of said plurality of second current sources produces a current having a component proportional to the absolute temperature of the second transistor to which it is coupled.

16. The apparatus according to claim 15 wherein said adjustable resistors comprise laser trimmed resistors implemented in integrated circuit form.

* * * * *